United States Patent [19]

Herbert

[11] Patent Number: 5,798,667

[45] Date of Patent: Aug. 25, 1998

[54] METHOD AND APPARATUS FOR REGULATION OF POWER DISSIPATION

[75] Inventor: Brian K. Herbert, Colorado Springs, Colo.

[73] Assignees: AT&T Global Information Solutions Company, Dayton, Ohio; Hyundai Electronics America, San Jose, Calif.; Symbios, Inc., Fort Collins, Colo.

[21] Appl. No.: 243,679

[22] Filed: May 16, 1994

[51] Int. Cl.[6] .................. H03L 1/02; H03L 7/00; H03B 5/04
[52] U.S. Cl. .......... 327/513; 327/115; 327/116; 327/99; 327/147; 327/156; 331/176
[58] Field of Search ................. 327/362, 512, 327/513, 113–121, 530, 538, 540, 544, 99, 298, 147, 150, 151, 156, 160, 161; 331/176; 364/707

[56] References Cited

U.S. PATENT DOCUMENTS

| | | | |
|---|---|---|---|
| 3,421,375 | 1/1969 | Dimon | 327/512 |
| 3,725,789 | 4/1973 | Mager | 328/3 |
| 4,017,748 | 4/1977 | Farnbach et al. | 307/240 |
| 4,023,094 | 5/1977 | Adams | 327/512 |
| 4,023,116 | 5/1977 | Alfke et al. | 327/156 |
| 4,050,097 | 9/1977 | Miu et al. | 364/200 |
| 4,151,611 | 4/1979 | Sugawara et al. | 365/227 |
| 4,353,128 | 10/1982 | Cummiskey | 370/44 |
| 4,380,745 | 4/1983 | Barlow et al. | 331/176 |
| 4,383,303 | 5/1983 | Hoffman | 377/47 |
| 4,480,312 | 10/1984 | Wingate | 364/557 |
| 4,500,953 | 2/1985 | Takezoe et al. | 364/200 |
| 4,571,728 | 2/1986 | Yoshikawa | 372/36 |
| 4,611,181 | 9/1986 | Fukumura et al. | 331/66 |
| 4,611,279 | 9/1986 | Andresen et al. | 364/200 |
| 4,621,360 | 11/1986 | Inoue | 370/85 |
| 4,636,656 | 1/1987 | Snowden et al. | 307/267 |
| 4,650,347 | 3/1987 | Shigemura et al. | 327/512 |
| 4,656,428 | 4/1987 | Ishikawa | 327/106 |
| 4,670,837 | 6/1987 | Sheets | 364/200 |
| 4,684,897 | 8/1987 | Richards et al. | 331/176 |
| 4,710,893 | 12/1987 | McCutcheon et al. | 364/900 |
| 4,734,871 | 3/1988 | Tsunoda et al. | 364/557 |
| 4,737,720 | 4/1988 | Mills | 327/106 |
| 4,746,879 | 5/1988 | Ma et al. | 331/176 |

(List continued on next page.)

FOREIGN PATENT DOCUMENTS

| | | | |
|---|---|---|---|
| 8502275 | 10/1984 | European Pat. Off. | |
| 0348045 | 5/1989 | European Pat. Off. | |
| 0409214 | 7/1990 | European Pat. Off. | |
| 0432925 | 11/1990 | European Pat. Off. | |
| 3516989 | 11/1986 | Germany . | |
| 57-110929 | 7/1982 | Japan | 327/512 |
| 4004605 | 9/1992 | Japan . | |
| 5-102807 | 4/1993 | Japan | 327/77 |

OTHER PUBLICATIONS

Keeping Cool with Power Management; OEM Magazine; Apr. 1994; p. 68.

CH8391 Advance Information; Chontel, Inc.; 1993; pp. 1–19.

*Primary Examiner*—Timothy P. Callahan
*Assistant Examiner*—T. T. Lam
*Attorney, Agent, or Firm*—Wayne P. Bailey

[57] ABSTRACT

The clock rate for a device is controlled through the use of integrated circuits which respond to the temperature of the device. Circuitry is added to the integrated circuit device being controlled which changes the clock rate of the device as the device temperature changes. The device clock is thus regulating by the temperature of the device. The way in which the regulation is implemented can be varied, from slowing an internally generated clock rate, or by digitally scaling an external clock input. Synchronous scaling is also provided, such that devices which are connected external to the CPU can still be clocked at the same external rate, but CPU transactions within the CPU may occur at a different rate depending on the CPU's measured temperature. This invention also provides the ability to selectively reduce or stop certain areas of an integrated circuit relative to pending operations or instructions being executed.

40 Claims, 13 Drawing Sheets

U.S. PATENT DOCUMENTS

| | | | |
|---|---|---|---|
| 4,812,733 | 3/1989 | Tobey | 323/285 |
| 4,825,104 | 4/1989 | Yamakoshi et al. | 327/63 |
| 4,864,496 | 9/1989 | Triolo et al. | 364/200 |
| 4,906,944 | 3/1990 | Frerking | 331/17 |
| 4,910,473 | 3/1990 | Niwa | 331/176 |
| 4,928,290 | 5/1990 | Vo | 375/118 |
| 4,949,055 | 8/1990 | Leitl | 331/158 |
| 4,970,473 | 11/1990 | Lietar | 327/156 |
| 4,978,838 | 12/1990 | Sanjuan | 219/497 |
| 4,990,907 | 2/1991 | Jikihara et al. | 340/825.5 |
| 5,008,904 | 4/1991 | Mangelsdorf et al. | 375/107 |
| 5,059,924 | 10/1991 | Cheek | 331/1 A |
| 5,070,443 | 12/1991 | Priem et al. | 395/725 |
| 5,079,696 | 1/1992 | Priem et al. | 395/500 |
| 5,081,701 | 1/1992 | Silver | 395/325 |
| 5,124,861 | 6/1992 | Shimotashiro et al. | 360/39 |
| 5,142,247 | 8/1992 | Lada, Jr. et al. | 331/14 |
| 5,142,556 | 8/1992 | Ito | 375/106 |
| 5,167,024 | 11/1992 | Smith et al. | 397/375 |
| 5,184,031 | 2/1993 | Hayakawa et al. | 307/296.3 |
| 5,189,314 | 2/1993 | Georgiou et al. | 307/271 |
| 5,191,657 | 3/1993 | Ludwig et al. | 395/325 |
| 5,218,314 | 6/1993 | Efendovich et al. | 328/155 |
| 5,233,161 | 8/1993 | Farwell et al. | 219/209 |
| 5,235,292 | 8/1993 | Endo et al. | 331/49 |
| 5,237,676 | 8/1993 | Arimilli et al. | 395/550 |
| 5,237,696 | 8/1993 | Best | 395/725 |
| 5,241,286 | 8/1993 | Mirow | 331/108 B |
| 5,256,980 | 10/1993 | Itri | 327/105 |
| 5,274,678 | 12/1993 | Ferolito et al. | 375/108 |
| 5,280,587 | 1/1994 | Shimodaira et al. | 395/275 |
| 5,280,623 | 1/1994 | Sodos et al. | 395/325 |
| 5,442,774 | 8/1995 | Pickup et al. | 377/48 |
| 5,451,892 | 9/1995 | Bailey | 327/113 |
| 5,477,417 | 12/1995 | Ohmori et al. | 327/512 |
| 5,485,127 | 1/1996 | Bertoluzzi et al. | 331/69 |

METHOD AND APPARATUS FOR REGULATION OF POWER DISSIPATION

TECHNICAL FIELD

The present invention relates to a technique for reducing power dissipation, and more particular to a technique for sensing temperature and regulating the frequency of operations performed in an electrical/electronic/optic circuit or system.

BACKGROUND OF THE INVENTION

New versions of central processing units (CPUs) dissipate relatively large amounts of power. Special cooling apparatus, such as large radiators or on-chip cooling fans, are used to remove the resulting heat. These high levels of heat generation result in additional manufacturing cost being incurred by requiring special packaging or special cooling devices. This also results in less-efficient motherboard designs, in that the heat generating devices must be physically separated from one another. These problems result in larger and more costly computer systems. Other types of electrical/electronic/optical devices suffer similar types of heat dissipation problems.

As newer computing systems provide higher levels of performance, methods of power control are needed to control power dissipation so as not to exceed the thermal dissipation capabilities of the system.

OBJECTS OF THE INVENTION

It is therefore an object of the present invention to provide an improved method and apparatus for reducing power dissipation in an integrated circuit device.

It is another object of the present invention to provide an improved method and apparatus for reducing power dissipation by a self-regulating integrated circuit device.

It is another object of the present invention to provide an improved method and apparatus for controlling power dissipation in a data processing system.

It is yet another object of the present invention to provide an improved technique for regulating the frequency of operations in a data processing system.

It is yet another object of the invention to provide a method and apparatus for semiconductor devices to change operating conditions when operating in a power conservation mode.

SUMMARY OF THE INVENTION

The clock rate for a device is controlled through the use of integrated circuits which respond to the temperature of the device. Circuitry is added to the integrated circuit device being controlled which changes the clock rate of the device as the device temperature changes. The device clock rate is thus regulated by the temperature of the device. The way in which the regulation is implemented can be varied, from slowing an internally generated clock rate (such as a voltage controlled oscillator or phase-locked loop), or by digitally scaling an external clock input.

This invention also provides the ability to selectively reduce or stop certain areas of an integrated circuit with respect to pending operations or instructions being executed. For example, a floating point execution unit inside a processor could be slowed or stopped while the integer unit continues operation. Alternatively, one or more execution units in a multi-execution unit data processing system can be selectively disabled. Semiconductor devices may also have their operating condition changed from a higher voltage to a lower voltage when operating in a power conservation mode.

The ability to limit power dissipation depending upon variable conditions, including sensed ambient temperature and device functions which are being used, provides the opportunity for lower cost systems. For example, lower cost device packaging (such as plastic instead of ceramic) and lower cost metals (such as aluminum instead of copper for lead frames and interconnect) are possible. In addition, lower cost system implementations through the elimination of cooling devices, vents, and spacing between components are also possible, thereby reducing the size of boards and cabinets. The present invention also allows for continued system operation in the case of battery-operated systems where maximum power consumption may be limited to some maximum value by the type of battery or batteries being used, or where the user or system may select to consume power at a lower rate to achieve longer operating duration and/or efficiency.

The present invention is further extendible to synchronous scaling, such that devices which are connected external to the CPU are still clocked at the same external rate, but CPU transactions within the CPU may occur at a different rate depending on the CPU's measured temperature.

An example of this is a CPU that offers clock doubling (or tripling) internally, but operates at some standard fixed clock rate externally. The power limitation control circuitry can be used to select multiplication factors of the internal clock such that the external rate is maintained; or alternatively to delay external clock events by an integral number of internal clock cycles.

DETAILED DESCRIPTION OF THE PREFERRED EMBODIMENT

Silicon is a material that is commonly used during the manufacture of semiconductor integrated circuits. Changes in the temperature of silicon (or other semiconducting materials) causes changes in electron mobility. As temperature increases, current through a device such as a diode typically increases as shown in the following equation:

$$i = I_s(e^{qv/KT} - 1)$$

In the above equation, $I_s$ is the reverse saturation current of the diode, q is the electronic charge ($q = 1.6 \times 10^{-19}$ coulombs), K is Boltzmann's constant ($K = 1.38 \times 10^{-23}$ joules/K), T is the absolute temperature (degrees Kelvin), and v represents the voltage across the diode. This equation provides an estimation of the changes in current with respect to temperature. There are additional effects (such as $I_s$ variation with temperature) that are not included in this equation.

For transistor devices, the saturation current ID through a field effect transistor (FET) can be reasonably approximated by the equation:

$$ID = K'W/L(V_{GS} - V_T)^2$$

where W is the width and L is the length of the transistor, $V_{GS}$ is the voltage difference between gate and source of the transistor, and $V_T$ is the turn on voltage of the transistor. K' is a temperature dependent parameter comprised from the following variables:

$$K' = (me_{ox}e_0)/2t_{ox}$$

where $e_0$ is the permitivity of free space, $e_{ox}$ is the permitivity of the gate oxide, $t_{ox}$ is the thickness of the gate oxide in angstroms, and m is the carrier mobility which can be expressed as approximately equal to 1/T (where T is the temperature in degrees Kelvin).

For transistor devices, the effect of increasing temperature is a decrease in FET current. For example, a change in device junction temperature from 0 degrees Celsius (273 degrees K) to 100 degrees Celsius (373 degrees K) results in a current drop of 26.8 percent. These principles are further described in "MOS/LSI Design and Application", by Carr, William N. and Mize, Jack P., Texas Instruments Electronics Series, McGraw-Hill Book Company, 1972 and which is incorporated by reference as background material.

It is this change in current relative to temperature that is used in the present invention to control other circuitry. This control may be implemented as a digital selection to control the operating characteristics, such as operating speed or supply voltage, of electrical/electronic or optical devices. The following will describe the use of either a diode or a FET device for sensing temperature and generating a control signal.

Figure 1:
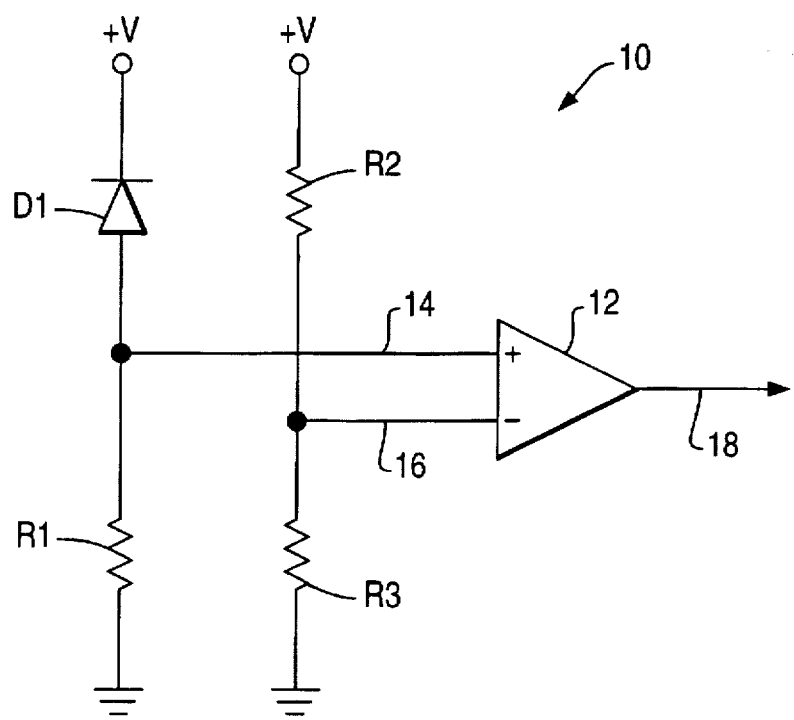
FIG. 1 is a schematic drawing of a diode-based temperature sensor and comparator.

FIG. 1 depicts a diode-based temperature sensing circuit 10. When the current through diode D1 exceeds some threshold value at 16, as determined by the resistor divider network R2 and R3, output 18 of the comparator (differential amplifier 12) goes HIGH, indicating that the threshold temperature has been reached. The output 18 of comparator 12 is used in the preferred embodiment as a control signal to select various clock rates, as will be further described below with respect to FIG. 3.

Continuing with FIG. 1, it was previously described that the reverse current through diode D1 increases as the circuit temperature rises. This increase in current results in an increased voltage at the positive (+) input 14 of the differential amplifier 12. When this voltage exceeds the threshold voltage 16 supplied by the R2/R3 voltage divider, the output 18 of the differential amplifier will be driven HIGH, allowing usage of this output as a digital logic level control signal. This circuit 10 is well suited for inclusion on the same integrated circuit die containing other integrated circuits whose temperature is being monitored.

Figure 2:
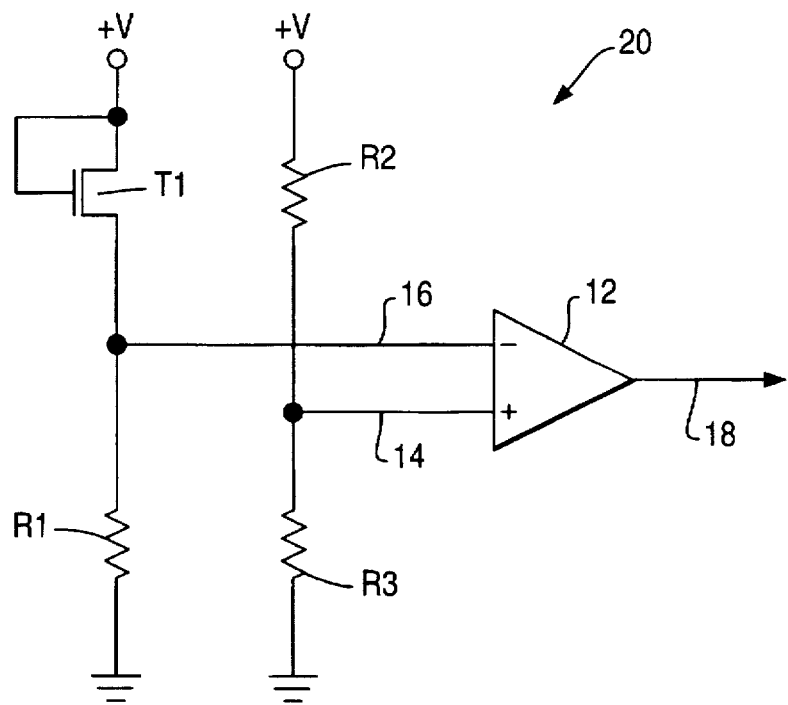
FIG. 2 is a schematic drawing of an FET-based temperature sensor and comparator.

A FET device can also be used for sensing temperature, as shown in FIG. 2. The trend as described by the FET current equation hereinabove is that forward current decreases with temperature. If a resistor R1 is connected in series with the transistor T1, the voltage at node 16 between the transistor and resistor will change as the current through the transistor varies. This voltage is compared with the voltage at 14 produced from the R2/R3 resistor divider to determine if the temperature has exceeded some limit. A HIGH output value (i.e. a logical ONE) indicates the measured temperature is above the setpoint, and a LOW output value (i.e. a logical ZERO) indicates the measured temperature is below the setpoint. It should be noted that in contrast to FIG. 1, since the current through the transistor T1 in FIG. 2 decreases with an increase in temperature, the voltage at 16 will drop as temperature increases. When this voltage becomes less than the reference voltage at 14, the output of comparator 12 switches to a logical HIGH level. Thus, the diode of FIG. 1 is connected to the positive (+) input 14 of comparator 12, whereas the transistor T1 of FIG. 2 is connected to the negative (−) input 16 of comparator 12. The circuit shown in FIG. 2 is also well suited for inclusion on the same integrated circuit die containing other integrated circuits whose temperature is being monitored.

The actual current through diodes or other semiconductor devices, at some given temperature, will vary in conjunction with process parameter variations. To accommodate these changes, a series of diodes may be produced, each of which has slight variations in its design such that the device which most closely produces the desired response can be selected when the device is tested. This can be done through fuse programmable logic commonly known in the art. Or, another common technique is to use an EEPROM or other non-volatile technology such that a register value specifies which device or set of devices should be used. Alternatively, laser trimming of devices could be used to change diode or FET characteristics, using techniques commonly known in the art.

Figure 3:
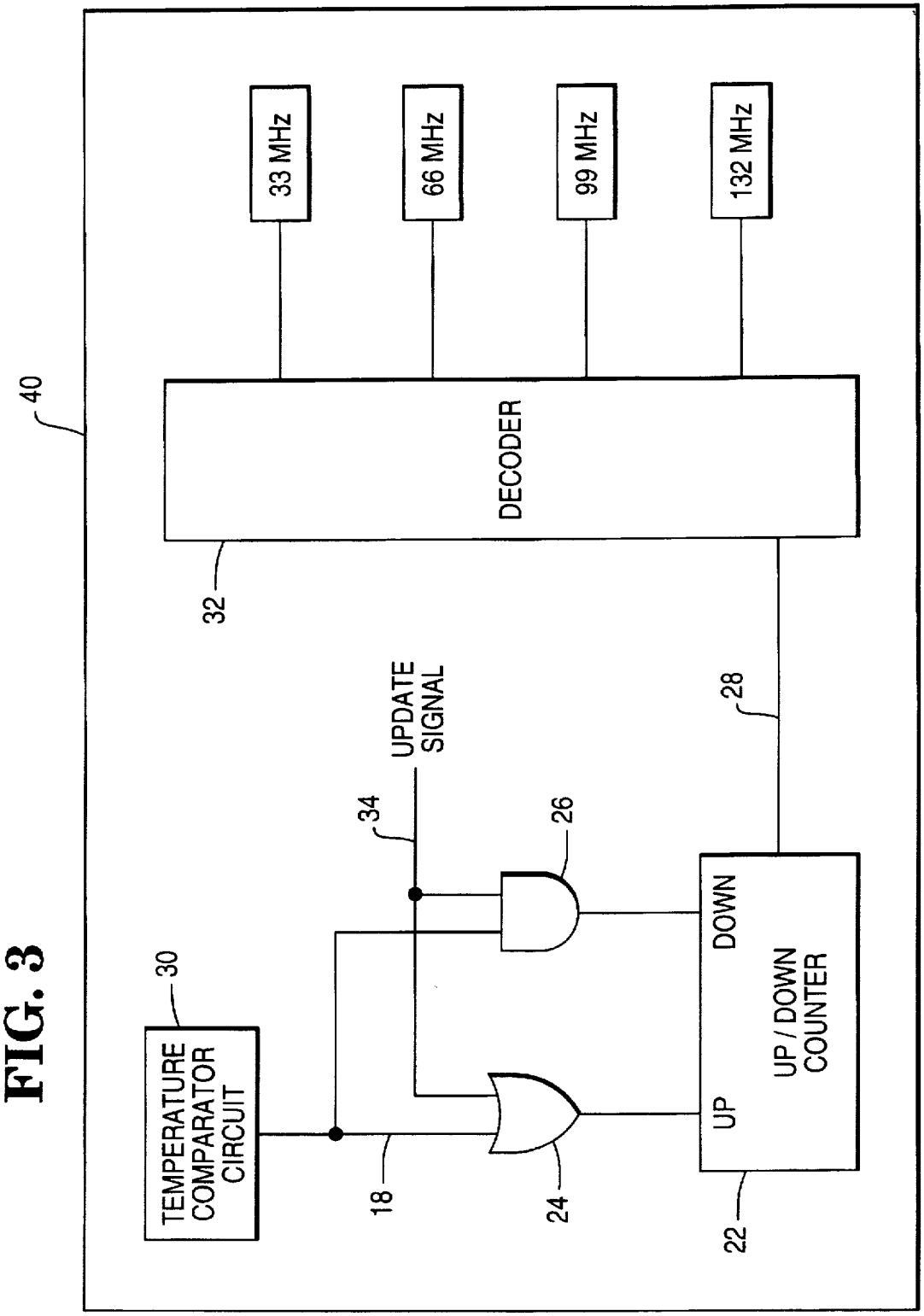
FIG. 3 a block diagram of a temperature comparator circuit being used to control the clock frequency in a data processing system.

The output 18 of the temperature comparator circuit (10 of FIG. 1 or 20 of FIG. 2) can be used to select different divide or multiply rates for generating an operating frequency from an external frequency. Referring now to FIG. 3, a clock frequency control circuit 40 is shown. This control circuit contains a temperature comparator circuit 30 (which is either the diode-based circuit 10 of FIG. 1 or the FET-based circuit 20 of FIG. 2) and an up/down counter 22 (which is used to select the operating frequency for a CPU or other type of device). An update signal 34 controls how often the output of the temperature comparator circuit 30 will be used to either increase or decrease the value in the counter 22, thereby increasing or decreasing the operating frequency. In the example of FIG. 3, a HIGH output from the temperature comparator circuit 30 indicates that the temperature has exceeded some threshold value. When this sensor output 18 is HIGH, the output of the 'OR' gate 24 is also HIGH, such that no clock pulses are provided to the counter control input labeled 'UP'. In addition, when sensor output 18 of comparator circuit 30 is HIGH, the output of the 'AND' gate 26 is equal to the update signal 34, causing the up/down counter 22 to decrease in value upon each activating transition of the update signal 34.

Figure 4:
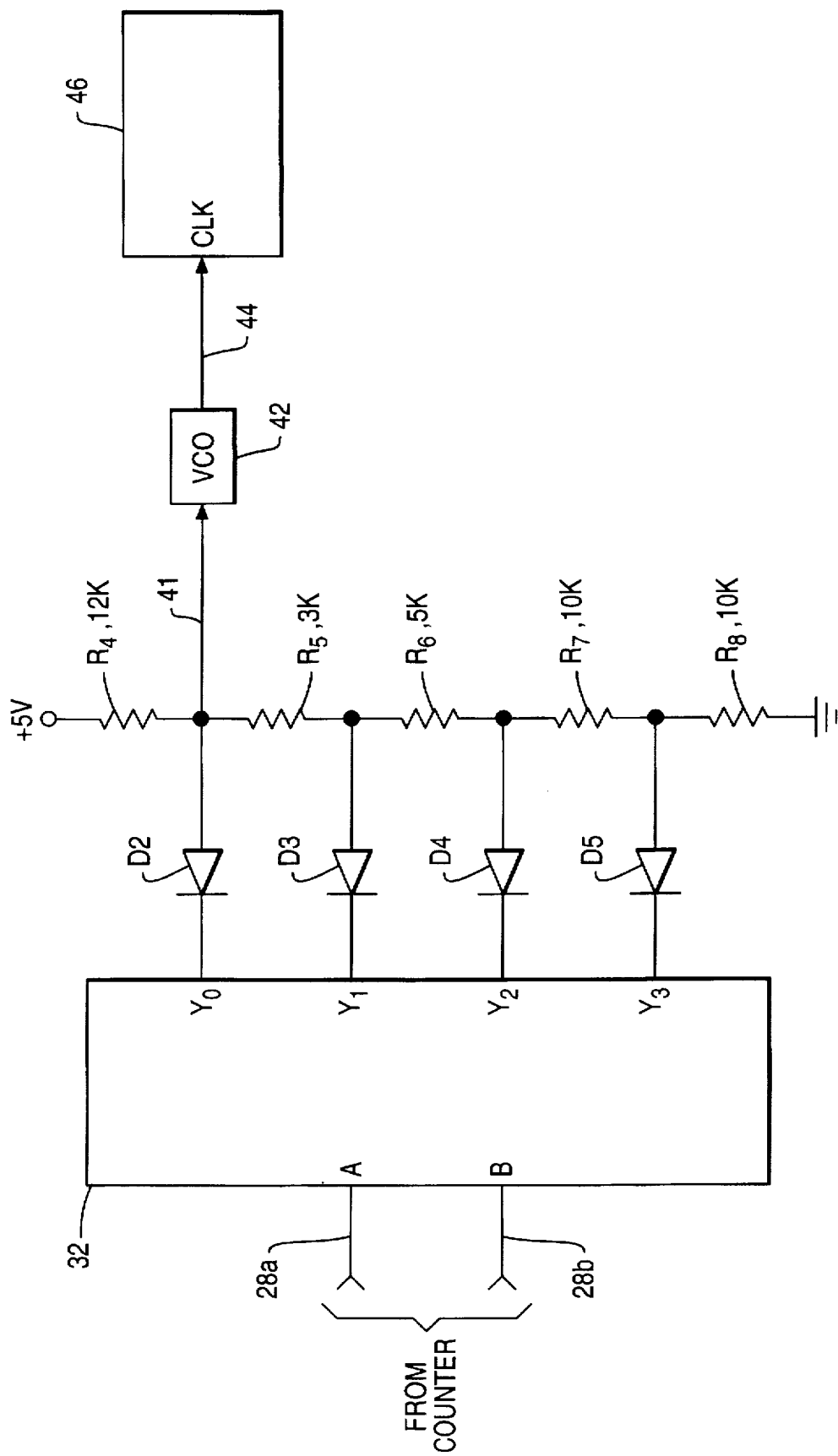
FIG. 4 is a schematic for selecting a clock frequency for an integrated circuit device.

The up/down counter 22 of FIG. 3 contains a binary value (00, 01, 10, 11) which represents the frequency divider used when converting the external clock rate to the internal clock rate. Other counter representations other than a frequency divider are also possible, such as a frequency multiplier. The output value 28 of the up/down counter 22 is operatively coupled at 28 (which comprises lines 28a and 28b, as is shown in FIG. 4) to a 2-bit to 4-line binary decoder 32. The output of decoder 32 is used to select the internal CPU/device frequency, such as 33, 66, 99 or 132 MHz.

One technique for selecting the internal CPU/device frequency is shown in FIG. 4. The four outputs $Y_0$-$Y_3$ of decoder 32 are coupled through respective diodes D2-D5 to a voltage divider network comprising resistors $R_4$-$R_8$. The particular values for these resistors can be chosen to match a particular voltage-controlled oscillator (VCO). For the circuit of FIG. 4, the resistors values were chosen such that the output 41 of the resistor network, which is coupled to VCO 42, varies from 0-3 volts depending on which output $Y_0$-$Y_3$ of decoder 32 is active. For example, a traditional 2-4 line decoder is known in the art to be a 74139, which has active LOW outputs. Thus, when inputs A and B and both logical ZERO, output $Y_0$ is LOW, and outputs $Y_1$-$Y_3$ are HIGH, resulting in approximately zero volts being output to VCO 42. When input A is a logical ONE and input B is a logical ZERO (which corresponds to a binary value of 01 being in counter 22 of FIG. 3), $Y_1$ is LOW, and $Y_0$, $Y_2$ and $Y_3$ are HIGH, resulting in approximately one volt being output to VCO 42. In similar fashion, a binary value of 10 in counter 22 results in approximately two volts being output to VCO 42, and a binary value of 11 in counter 22 results in approximately three volts being output to VCO 42. For a different VCO having different input voltage range requirements, different values for $R_4$-$R_8$ may be chosen to expand or contract the range of voltages applied to VCO 42 for various counter 22 output values 28.

VCO output signal 44 is thus a clock signal whose 1s frequency is selectable, based upon the value maintained in counter 22. This clock signal is coupled to the input clock signal of CPU/device 46. Therefore, the CPU/device is clocked at a variable rate depending upon temperature. The circuit shown in FIG. 4 is well suited for integrating the frequency selection circuitry onto the same integrated circuit die containing other integrated circuits which are being temperature monitored.

Figure 5:
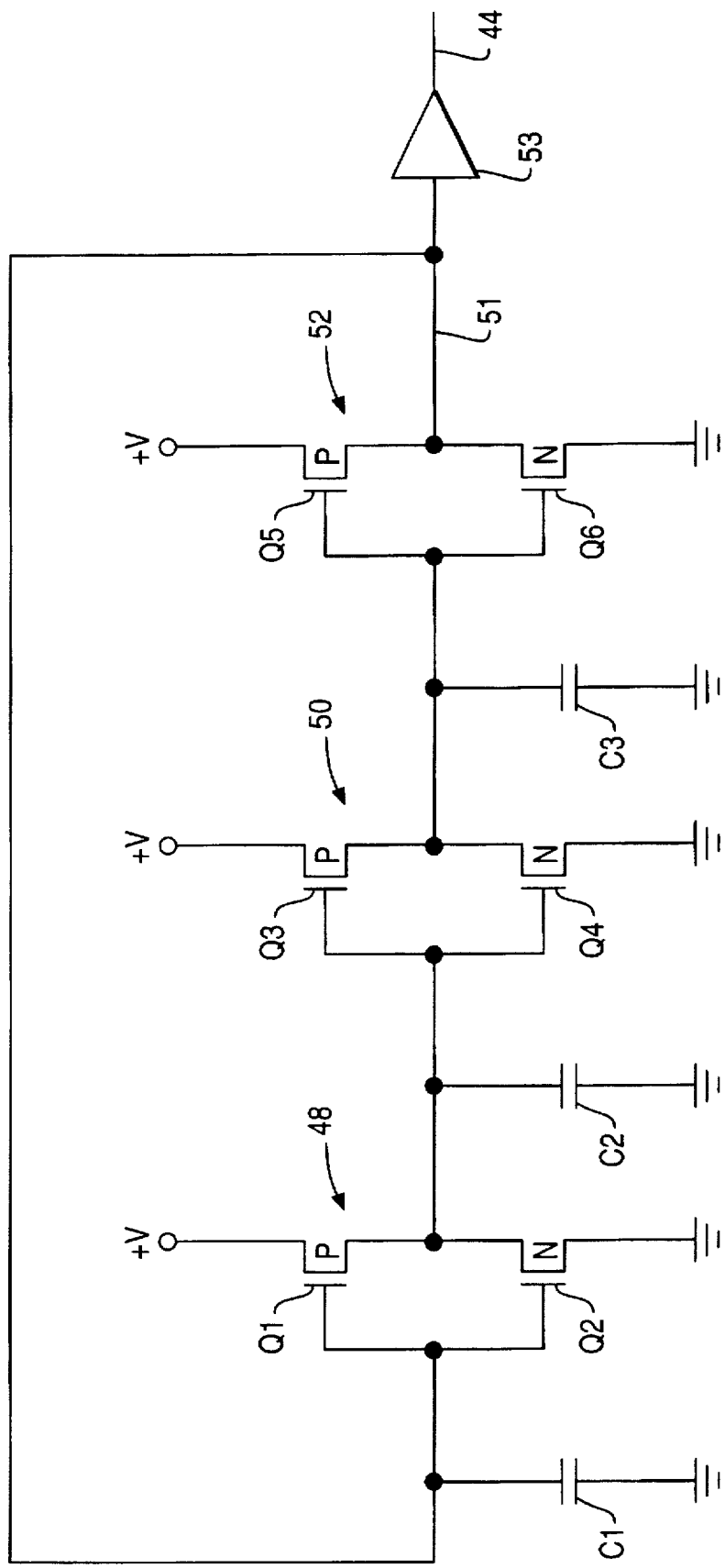
FIG. 5 is a schematic drawing of a temperature sensitive ring oscillator.

Another way in which the variation in current through the FET device can be utilized is through a ring oscillator. FIG. 5 shows three inverters (48, 50 and 52), where the output from one inverter is coupled to the next inverter. The end inverter 52 has its output 51 coupled to the starting inverter 48. Each inverter 48, 50 and 52 is comprised of a P-channel and N-channel FET. A capacitor (C1, C2 and C3 respectively) is attached to the input of each inverter such that there is a charge time at each node until the next inverter switches. Since FET current decreases with increasing temperature, the ring oscillator shown in FIG. 5 will run at slower frequencies as temperature increases. When the end inverter output signal 51 is used to drive a CPU/device clock input (as shown at 44 in FIG. 4), a high current buffer circuit 53 may optionally be added in order to match the ring oscillator with the current requirements of the CPU/device. The size of the capacitors C1-C3, and the length and width of the P and N channel transistors Q1-Q6, can be modified using commonly known techniques to tailor the frequency range of the ring oscillator.

Figure 6:
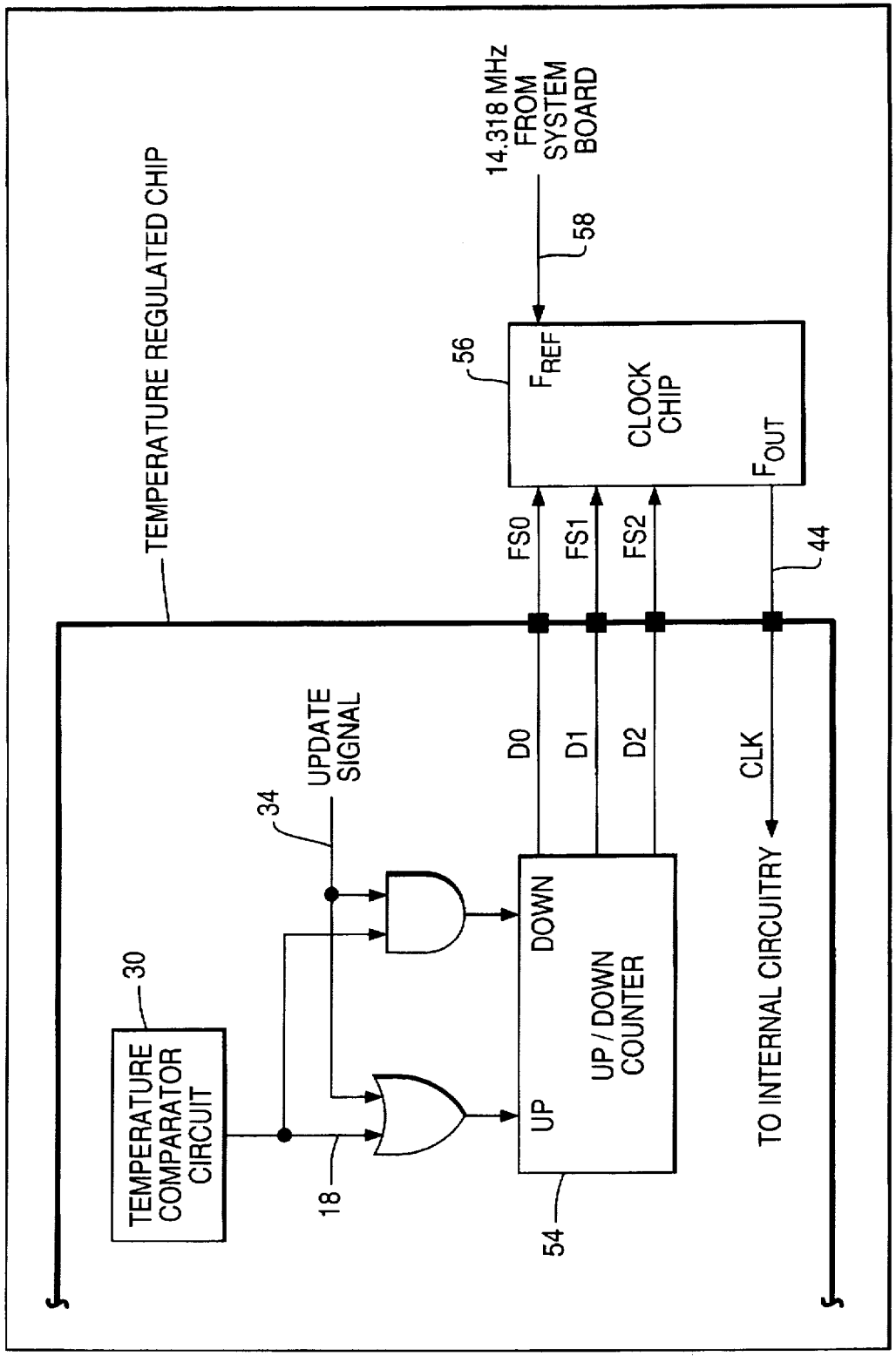
FIG. 6 is an alternative schematic for selecting a clock frequency for integrated circuit device.

Applications which require more exact control of the operating frequencies can employ a phase-locked loop clock generator circuit, which is used in conjunction with the temperature comparator circuitry previously described. An up/down counter with a greater number of bits can also be employed. Referring now to FIG. 6, the value stored in the up/down counter 54 is driven on output pins D0-D2. These output pins are coupled to inputs FS0-FS2 of an external clock oscillator chip 56, such as the ICS 1394 chip which is commercially available from Integrated Circuit Systems (and whose address is 2435 Boulevard of the Generals, Valley Forge, PA 19482-0968). Several other suppliers offer similar types of devices. The value of the up/down counter 54 serves as the frequency select input value for the clock chip 56. The resulting output frequency $F_{OUT}$ 44 is derived from a reference frequency FREF 58 in conjunction with the frequency select input value presented at inputs FS0-FS2. In the preferred embodiment, this reference frequency FREF is 14.318 MHz, which is generated from an external crystal oscillator on the system board. Clock chips may also have a mask programmable set of frequencies, or may be software programmed, to define the frequency which will be output on the FOUT pin 44 for each set of values for FS0-FS2.

The above described techniques can also be used with CPU architectures which have a constant clock rate for bus transactions, but have a different internal clock rate. An example of this is Intel's 486DX2/66 CPU, which provides the same bus clock rate as a standard 33 MHz 486 CPU, but operates at a 66 MHz internal clock rate. Processors which can operate the internal clock at some multiple of the external clock rate typically contain a phase-lock loop (PLL) clock generator circuit which is used to synchronize the internal clock to the externally supplied clock. Operations internal to the processor take place at the faster clock rate. Operations external to the processor operate at the external clock rate by using the externally supplied clock for timing of input and output functions. This results in part because the Intel 80486 bus is a 'not ready' bus such that address and data for the bus cycle remain on the bus until the receiving device asserts RDY# (ready). The timing of this assertion is relative to the external clock such that the external timing is defined by the external clock while the internal timing may be defined by some multiple of that clock.

Figure 7:
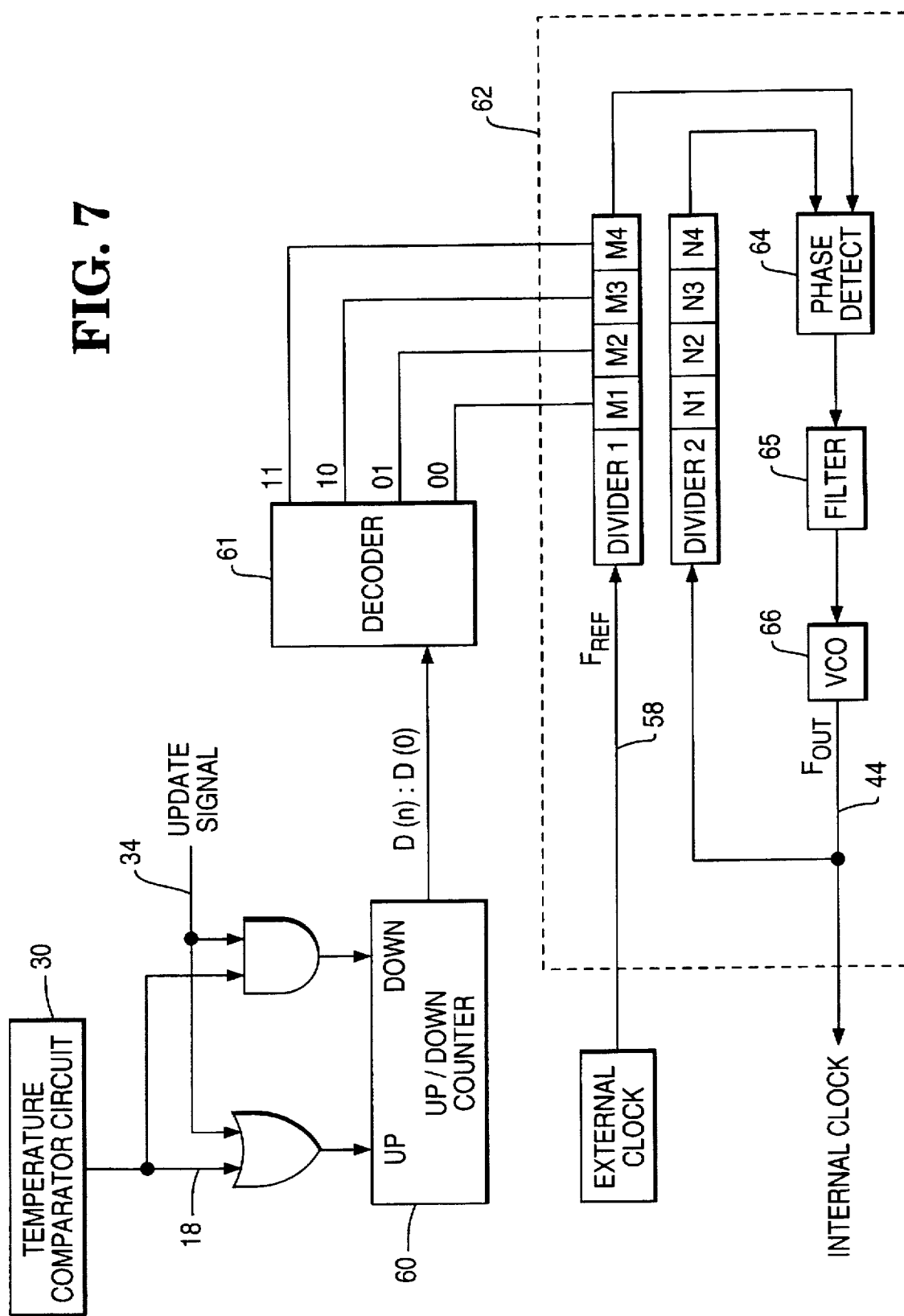
FIG. 7 is a circuit for variable scaling using a temperature controlled phase-locked loop.

The invention described herein allows for switching a microprocessor's internal clock between multiples of the external clock rate as temperature of the device varies. Referring now to FIG. 7, a reference frequency $F_{REF}$ 58 is divided by some integer value M, and then compared by phase detector 64 with the VCO 66 output frequency $F_{OUT}$ divided by N. A phase-locked loop, by its very nature, adjusts its internal operating frequency to lock to a reference frequency. In this way, the following equation is established for PLL 62:

$$F_{REF}/M = F_{OUT}/N$$

or $$F_{OUT} = F_{REF} * N/M$$

The net effect of this equation is that a PLL clock generator 62 is implemented such that some external reference frequency FREF (typically 14.318 MHz from the system board; or alternatively the CPU external bus clock rate, which is frequently 25 or 33 MHz) is multiplied by a value of N and then divided by a value of M, where N and M are both integers. In this manner a range of frequencies can be derived from the reference frequency. When a new frequency is selected (through new values for N or M), the circuit shown in FIG. 7 will 'home in' on the new frequency.

Continuing with a detailed description of FIG. 7, the phase-locked loop clock generator 62 contains dividers (Divider 1 and Divider 2), as well as phase detector 64, loop filter 65 and VCO 66. The divide value M for Divider 1 is selected according to the binary output value of decoder 61. The divide value N for Divider 2 is selected by software control. The remaining portion of the circuitry of FIG. 7 operates as previously described with respect to FIG. 3. The decoder 61 outputs a binary value which is used to select a divide value M for Divider 1, based upon the sensed temperature of the particular integrated circuit being monitored.

A representative example of the operation of FIG. 7 will now be given. Assume that the external clock FREF is running at 33 MHz. Recall that the external bus is also operating at the external clock rate. Assume that the values for M1–M4 have been pre-defined to be M1=12, M2=6, M3=4, and M4=3. Further assume that the divider value for Divider 2 is initially set at N=12, via a software routine, and M is initially set to M4. According to the previously derived equation, the output frequency $F_{OUT=FREF} * N/M$, which becomes $F_{OUT}$=33 MHz * (12/3)=132 MHz. The internal clock 44 for the CPU/device is thus operating at four times the clock rate of the external clock 58. Now assume that the temperature of the CPU/device increases, resulting in a decrease of the counter 60 output value D(n):D(0). If this decrease resulted in the M3 value being selected by decoder 61, the resulting internal clock frequency would be 33 MHz * (12/4)=99 MHz. In similar fashion, an even greater increase in temperature would result in the M2 divider value being selected by decoder 61, resulting in an internal clock frequency of 33 MHz * (12/6)=66 MHz. Finally, if the monitored device continued to rise in temperature, decoder 61 would select divider value M1, resulting in an internal clock frequency of 33 MHz * (12/12)=33 MHz. Thus, the internal clock is switched between multiples of the external clock rate depending upon the temperature of the device being monitored.

Depending on system characteristics, the clock output 44 may be used to drive the CPU/device internal clock while it is stabilizing, or the clock output 44 may be held at some logic level until the frequency has stabilized. Alternatively, a synchronous clock system as described below can be used to eliminate this required stabilization delay.

For synchronous clock systems, the PLL clock frequency can be held constant. A divider circuit is then connected to the PLL clock output $F_{OUT}$. This synchronous scaling technique allows for various fractions of the PLL frequency to be easily selected, and switched on selected clock edges, such that there is no glitching or stabilization time. In the case of clock doubling, tripling or quadrupling schemes, the PLL frequency controlled by N and M values is set to operate the PLL at some multiple of the maximum rate of the CPV/device being temperature monitored.

Figure 8:
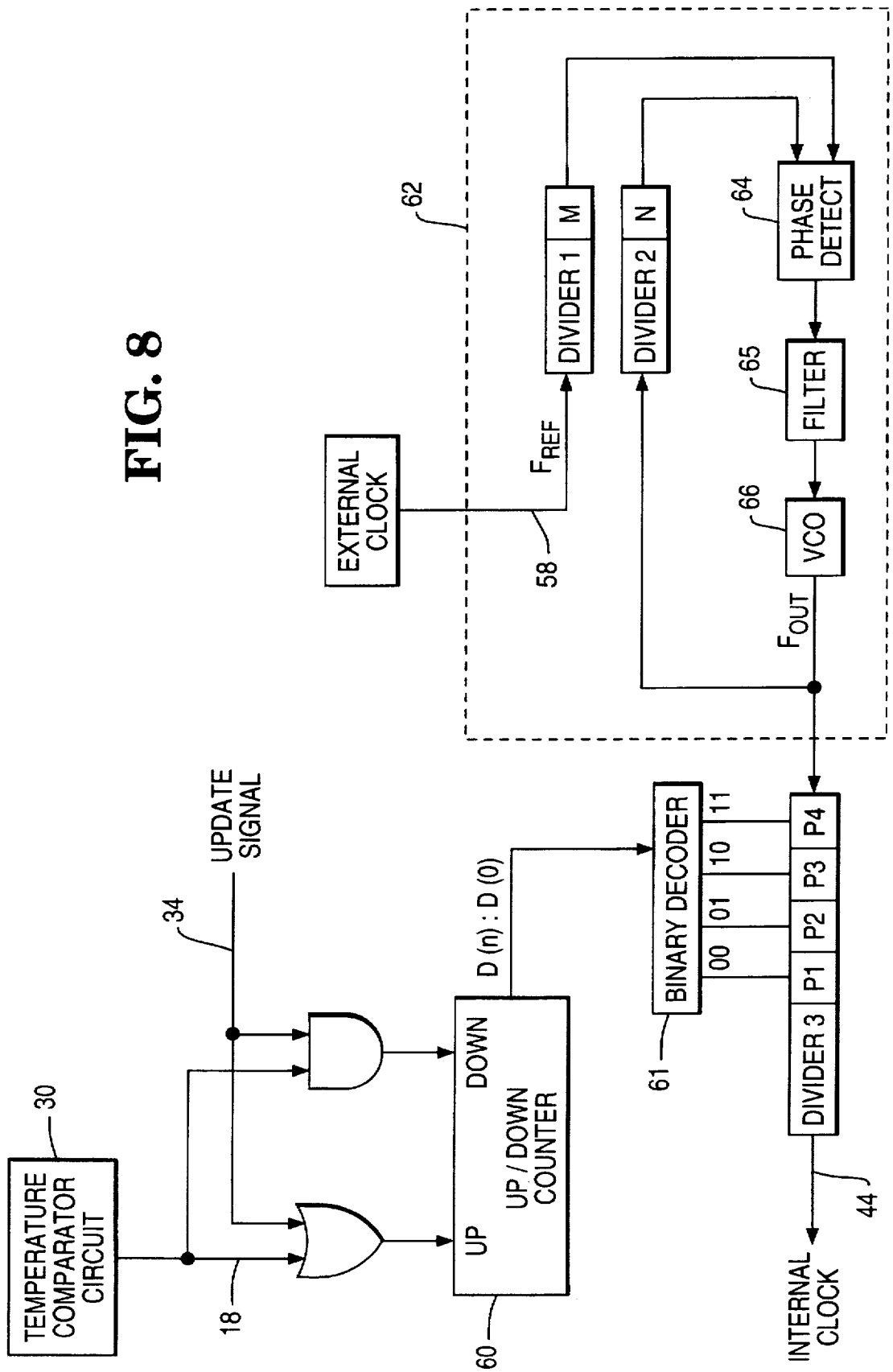
FIG. 8 is a circuit for synchronous scaling using a temperature controlled phase-locked loop.

Referring now to FIG. 8, the values for N and M are selected by software such that the frequency of the PLL is some multiple of 132 MHz. For example, if M is 3 and N is 12, the PLL will home in on 132 MHz (a multiple of one). Particular values for Divider 3 are then selected by the temperature sensor circuit using similar techniques as described above with respect to FIG. 3. The Divider 3 P values which may be selected by decoder 61 are initially established by software, such that divide by 1 (the P1 value for 132 MHz internal clock), divide by ¾ (the P2 value for 99 MHz internal clock), divide by 2 (the P3 value for 66 MHz internal clock) and divide by 4 (the P4 value for 33 MHz internal clock) scale factors are available. In similar fashion, if PLL 62 was operated at a PLL clock rate of 528 MHz (a multiple of 4), by choosing M=2 and N=32, the P values would be initially established by software to be P1=4, P2=3, P3=8 and P4=16. Decoder 61 would then select the appropriate P divide value to regulate the frequency of CPU/device internal clock 44.

Figure 13:
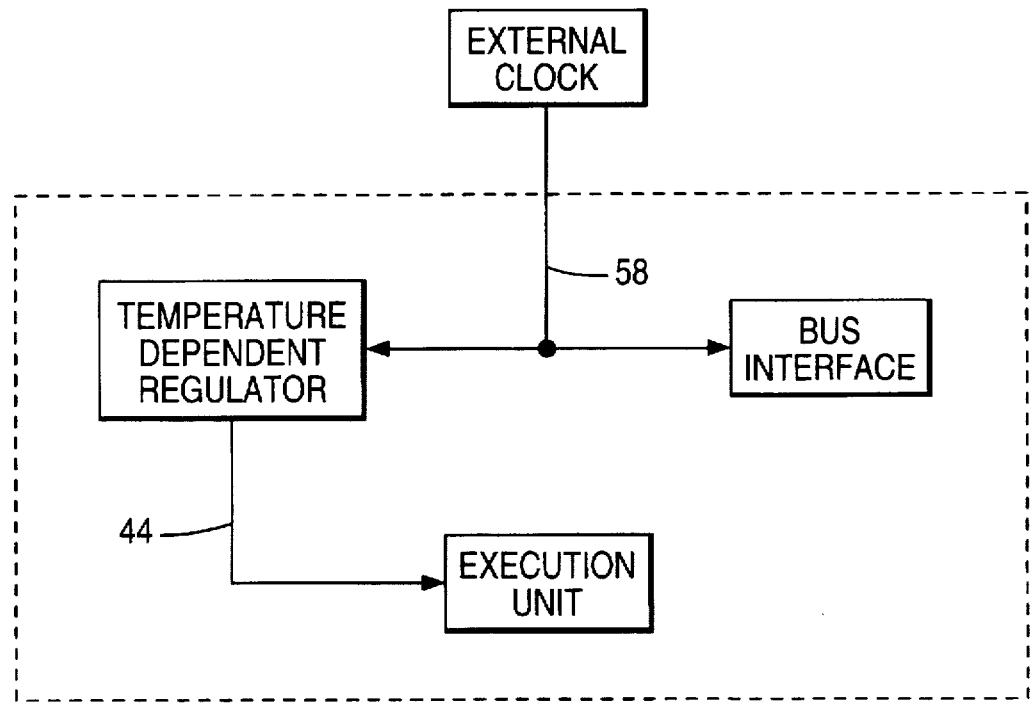
FIG. 13 is a functional diagram of a system for operating a bus at a fixed frequency, and an execution unit at a selectable frequency.

A block diagram of the detailed circuitry of FIGS. 7 and 8 is shown in FIG. 13. An external clock device such as a crystal oscillator is used to generate a reference frequency 58. The reference frequency is used to operate a bus interface at a fixed clock rate. The reference frequency is also input to a temperature-dependent regulator, which generates an internal clock signal 44 for use by an execution unit. This frequency of this internal clock signal is dependent upon temperature. In the preferred embodiment, all circuitry depicted by the functional blocks within the dotted box of FIG. 13 is disposed on an integrated circuit chip/device.

Another method which can be used to eliminate stabilization delay is to have two PLL clock generators, where one PLL is used to generate the first clock rate while a second PLL provides a second clock rate. This technique eliminates stabilization time for the second clock, since the second clock is already operating at the desired frequency. Edge sensing circuitry can be used to provide glitchless switching between the two clock rates, using techniques known in the art.

The present invention also allows flexibility in packaging for CPU products. For example, the floating point capabilities of some CPUs may be utilized only occasionally, depending on the applications the user runs. For example, Microsoft Windows running a word processor application has little floating point activity. When the floating point unit is not used, it generates less heat. If the Windows word processing market is a target for the CPU vendor, the vendor may choose to package the CPU in a lower cost package which provides ample heat dissipation for fixed point operation, but is not sufficient to support simultaneous fixed and floating point execution. In this case, on-chip frequency regulation of the floating point unit could be provided by the present invention to provide optimum performance. In this way, a CPU product could be packaged in a lower cost package, operate at full speed for normal fixed point operation, and then frequency regulate the floating point unit when more heat is generated by floating point operations. The frequency regulation slows down the floating point unit's clock, as previously described, to reduce power dissipation in a manner to conform with the low-cost packaging for the CPU.

Figure 9:
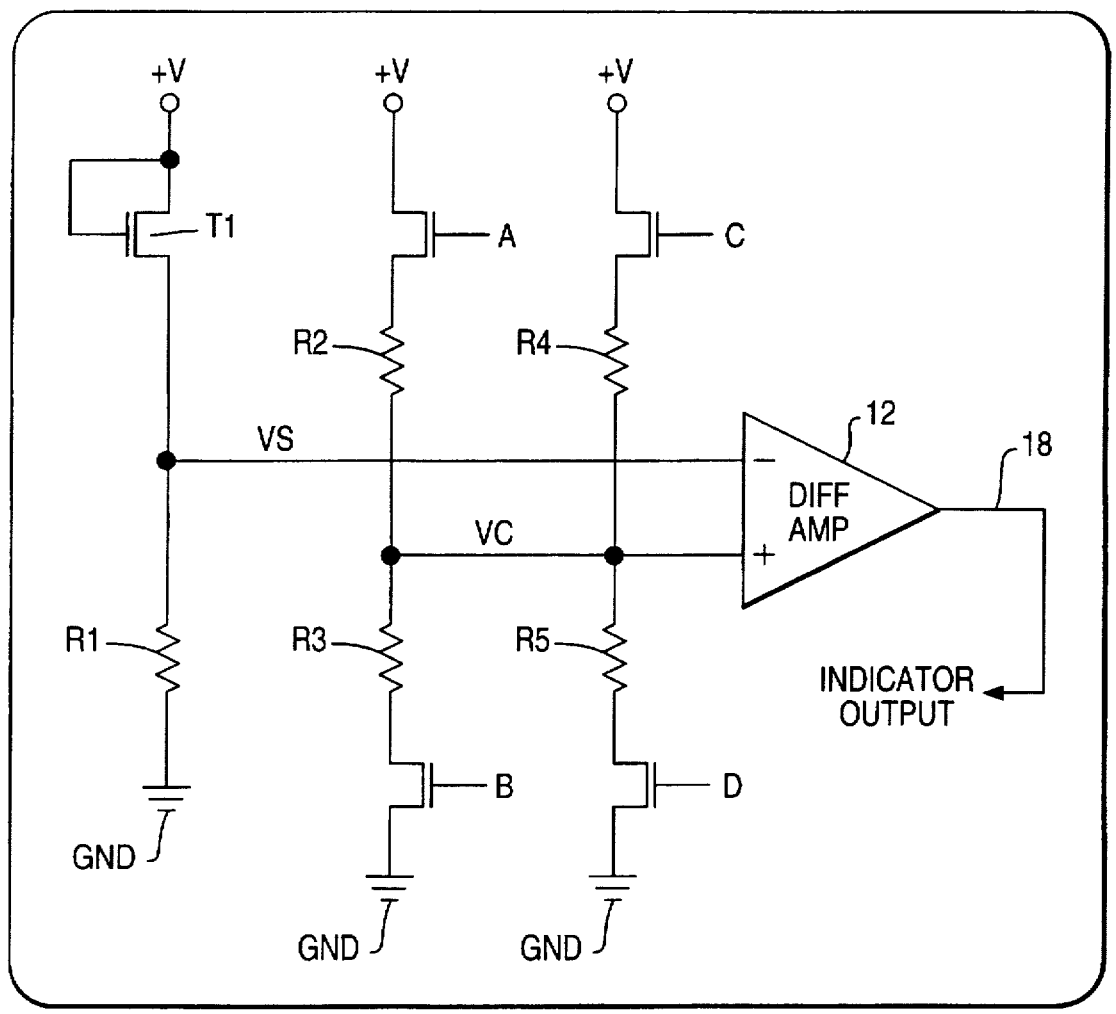
FIG. 9 shows a selectable temperature setpoint circuit.

Another aspect of this invention is the ability to adjust to the available thermal conditions. If heat sinks or cooling fans are added, greater heat can be dissipated, allowing higher frequencies of operation. Different temperature thresholds could be used, depending on the CPU application and the desired device longevity. These different thresholds may be obtained by adjusting the resistance values for the R2/R3 voltage divider of FIGS. 1 and 2. In an alternate embodiment, the temperature sensing circuitry contains a number of R2/R3 resistor pairs which are selected by accessing a register through software program control. The register value could alternatively be selected through logic levels on external pins. This dynamic temperature setpoint approach allows selection of different clock rates under CPU control, as a function of measured temperature. As shown in FIG. 9, the-selection of different resistor values (which determines the voltage supplied to the positive (+) terminal of a differential amp) is used to select different 'setpoint' temperatures. The setpoint may be determined by the voltage produced from R2 and R3 (when gates A and B are active), or other combinations such as R2 and R4, or even the combination of R2 and R4 plus R3 and R5 in parallel.

Figure 16:
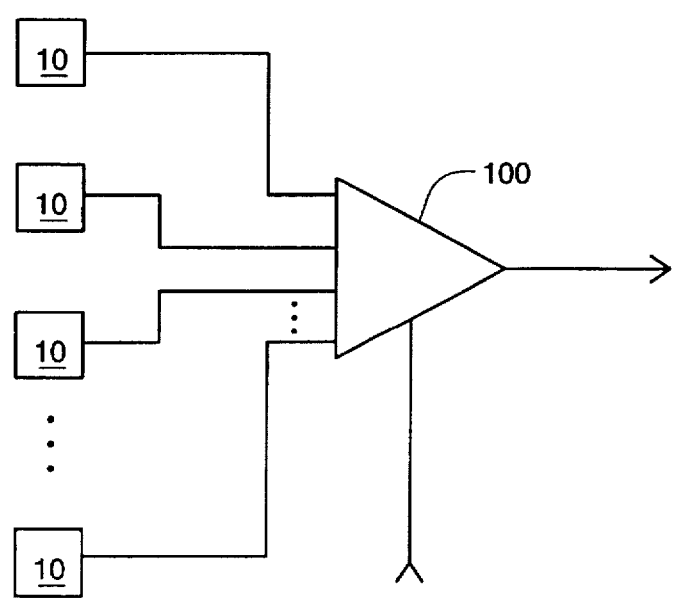
FIG. 16 shows multiple temperature sensors disposed on an integrated circuit device.

The method of switching between various R2/R3 pairs may have variations due to analog effects depending on the particular implementation method used. For example, it may be difficult to produce stable or repeatable results. Since the temperature sensing circuitry is quite small, several sensing circuits can be produced on one integrated circuit, 10 with the output from each comparator being input to a multiplexor 100 which is controlled through a software routine, as shown in FIG. 16. One benefit of having multiple sensing circuits (and then selecting which output to use via a multiplexor) is that all selection is accomplished in the digital domain.

The use of more than one temperature sensor also allows for establishing temperature windows or hysterisis for operation. For example, in some circumstances it may be desirable to establish an upper and lower temperature range of operation, where one sensor establishes the upper trip point, and another sensor establishes the lower trip point. The use of hysterisis techniques provides additional stability to temperature sensors, in a similar fashion to that obtainable by thermostat hysterisis.

Figure 10:
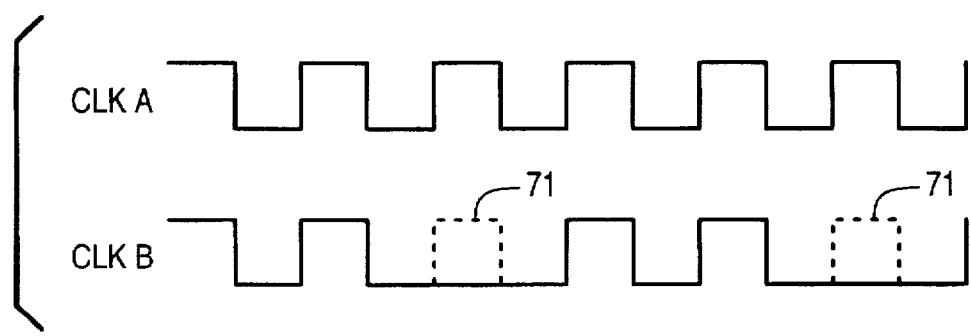
FIG. 10 shows a clock being disabled from time to time in order to reduce power consumption.

Another use of the above described invention is to insert "wait states" in a clock signal, which may be synchronized with certain operating conditions, in order to reduce the overall rate of operation and thereby reduce the amount of generated heat. For clocked logic implementations, the clock can be stopped or held at a ONE or ZERO logic level for some extended period in order to reduce the power consumed. FIG. 10 shows two clocks, CLK A and CLK B, wherein CLK B is stopped from time to time in order to achieve such reduction in power consumption. CLK B is generated from CLK A, with the difference being that CLK B does not produce a high going pulse in the areas drawn in light gray at 71. How often pulses are eliminated can be controlled by a counter mechanism similar to that described above with respect to counter 22 in FIG. 3, and as further described below.

Figure 11:
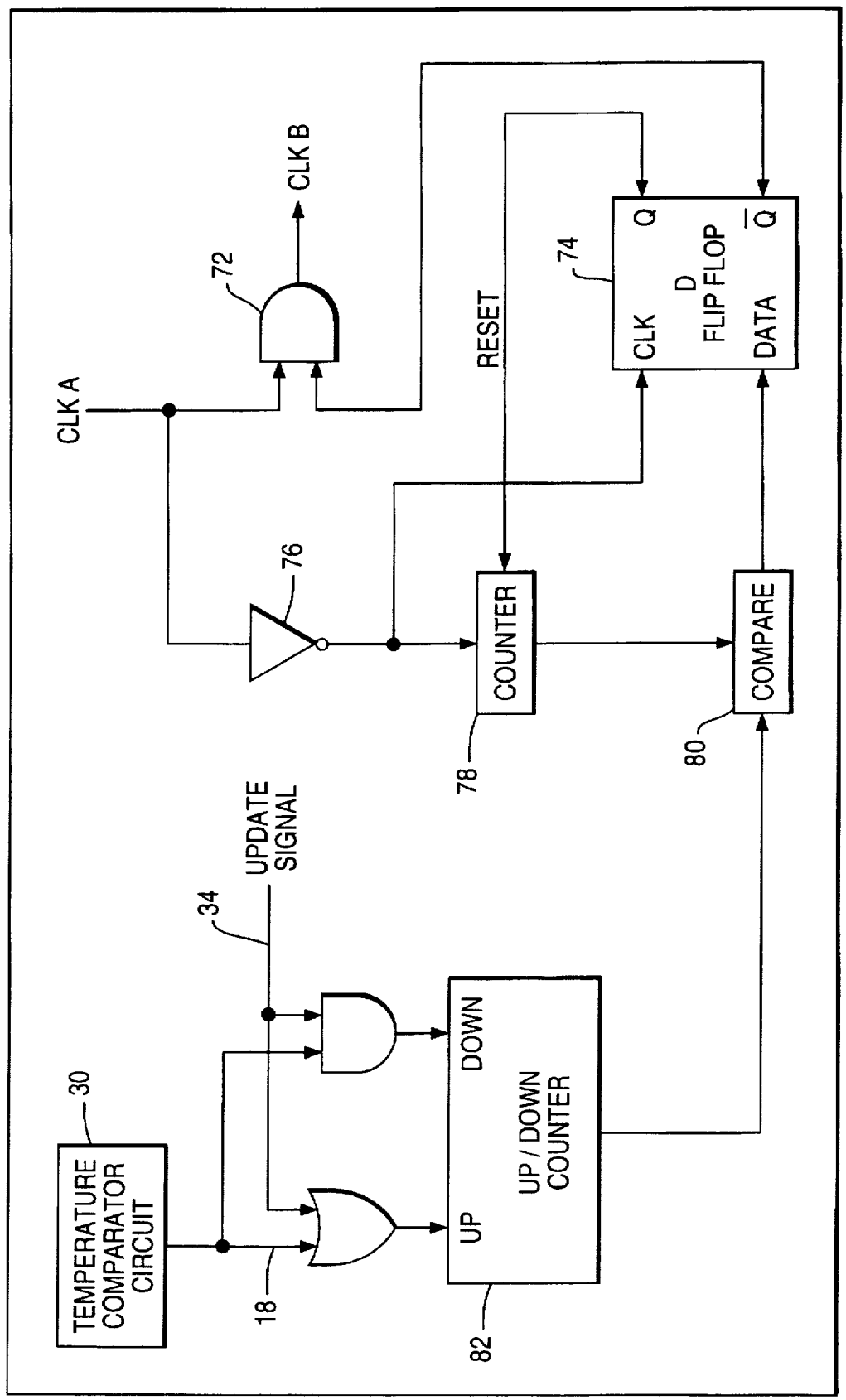
FIG. 11 is schematic for a temperature dependent clock modulation circuit.

FIG. 11 shows a circuit for modulating a clock signal based upon temperature. CLK A is fed to a logic AND gate 72, whose other input is connected to the $\bar{Q}$ output of D-type flip flop 74. CLK A is also inverted by inverter 76 and input to counter 78. The output of counter 78 is compared at 80 to the value stored in up/down counter 82 (which varies with the sensed temperature, as previously described with respect to FIG. 3). This comparator 80 outputs a logical ONE level to the data input of flip flop 74 when the magnitude of the two counters is the same. When a logical ONE value is clocked into flip flop 74, the Q output becomes a logical ONE value which causes counter 78 to be reset. The $\bar{Q}$ output is then a logical ZERO value, causing the output of AND gate 72 to remain at a low level, thereby holding the clock output (CLK B) at a logical ZERO value for one clock period. The counter mechanism and flip flop operate with an inverted CLK A signal such that they provide sufficient setup time for the AND gate.

In summary, FIG. 11 illustrates a circuit for generating CLK B, where CLK B is the same as CLK A except that it is held at a low value every M pulses (where M is the value stored in the up/down counter 82). There can be many variations on this circuit, including using divide circuitry for the clock feeding the counter 78 such that low pulses are inflicted every M*N pulses, where N is the divide rate of the clock feeding the counter 78.

Another use for this invention is for portable equipment, where there is typically a non-linear relationship between battery life and current draw. In other words, battery life at a one-watt consumption rate is usually more than twice the life than for a two-watt consumption rate. For operations indoors, the power dissipation of the CPU can be estimated from the temperature of the silicon. Through the present invention, the operator of the portable computer could select some power level of operation which corresponds to a desired battery life, and then enable the invention through hardware or software control (as previously described with respect to FIGS. 7 and 8) such that power dissipation is limited to some value. For example, a processor may start out with a 99 MHz internal clock rate, but if the processor temperature rises above some threshold value, the internal rate could be changed to 66 MHz to reduce the amount of heat being generated within the device.

In addition, the ability to have variable setpoints (as previously described with reference to FIG. 9) allows accommodation of some battery types where longer operation can be achieved by reducing the power draw as the battery is discharged.

It is also possible to conserve power through a reduced voltage operation. A number of semiconductor manufacturing processes are capable of operating at both five volts and three volts (typically the designs are derated for three volt operation; for example, a circuit at three volts may operate at 60% of the speed when operating at five volts). A semiconductor circuit can be considered as a set of resistances and capacitances. The resistance represents the on or off condition resistance for the transistors, and the capacitance is the capacitance of each node. The power consumed during operation is closely related to the amount of capacitance charged. The energy in charging a capacitor C is equal to:

$$E = \tfrac{1}{2}CV^2 (V=\text{voltage})$$

From this equation it can be seen that a device operating at 3 volts consumes only 9/25 of the energy used when operating at five volts. The advantage of operating at five volts is that the current through the transistor is greater, such that nodes are charged or discharged more quickly, providing faster circuit operation.

Figure 12:
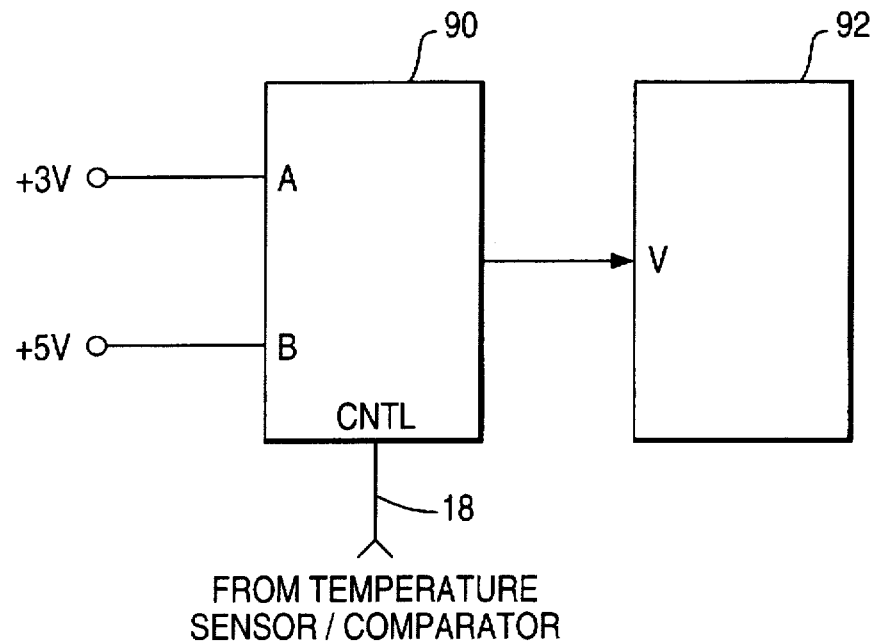
FIG. 12 is a circuit for selecting between different supply voltages based upon a sensed temperature.

The above characteristics lend themselves into an operating method where three volt operation can be used for lower power mode, such as when operating from a battery, and five volt operation could be used when maximum performance is desired, or when the product is powered from an outlet or docking station. The selection between five volt and three volt operation can be selected via software control, where the software outputs a signal to selectively enable a three or five volt supply voltage. Alternatively, the temperature sensing circuitry could directly control the three or five volt selection such that power dissipation remains below some average level. For example, as shown in FIG. 12, the output signal 18 of FIGS. 1 or 2 is coupled to the control input of an analog multiplexor 90. The analog multiplexor has three and five volts connected to its A and B inputs, respectively. The output of the multiplexor (three or five volts) is coupled to the supply voltage of CPU/device 92.

Reduced power consumption can also be achieved by selectively disabling parts of a device or circuit. For example, a super scalar processor which has multiple parallel execution units may shut off one or more of the execution units to save the power consumed by those units. The temperature sensing comparator of FIGS. 1 or 2 can be used to provide the digital signal which turns off additional execution units.

One method of implementing such a circuit is to use the setpoint circuit shown in FIG. 1 such that if the output indicates that some temperature point has been passed, the aforementioned circuitry can be disabled. For example, the Intel Pentium processor contains two pipelines that can execute instructions simultaneously. The present invention can be used to disable one of the pipelines in a manner that once the setpoint signal has become active, no additional instructions are routed to that execution unit by the processor's prefetch or scheduler logic.

Figure 14:
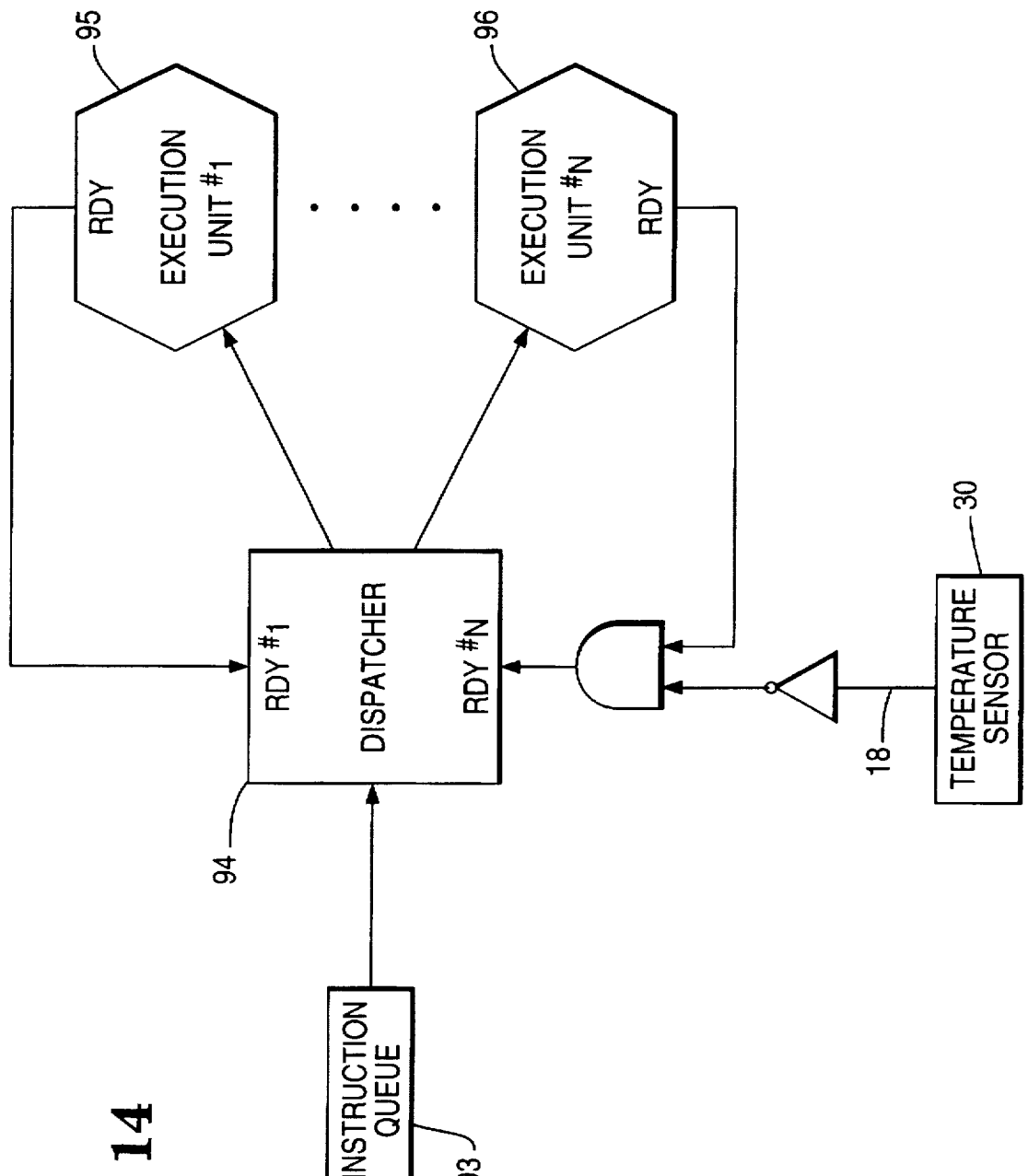
FIG. 14 shows a system for selectively enabling and disabling of a device or circuit.

Another method of disabling one or more execution units is shown in FIG. 14. Here, a dispatcher 94 reads instructions from an instruction queue 93. The dispatcher dispatches such instructions to particular execution units 95 and 96. Each execution unit has a ready (RDY) signal, indicating it is ready to receive more instructions to be executed. The temperature sensor output signal 18 is used to selectively disable the ready signal sent to the dispatcher when the temperature exceeds some limit. Alternatively, and on the particular processor architecture, the disabling function may be implemented by forcing a particular instruction queue indicator for a particular execution unit to the full position, thereby inhibiting the acceptance and subsequent execution of additional instructions by that execution unit.

Figure 15:
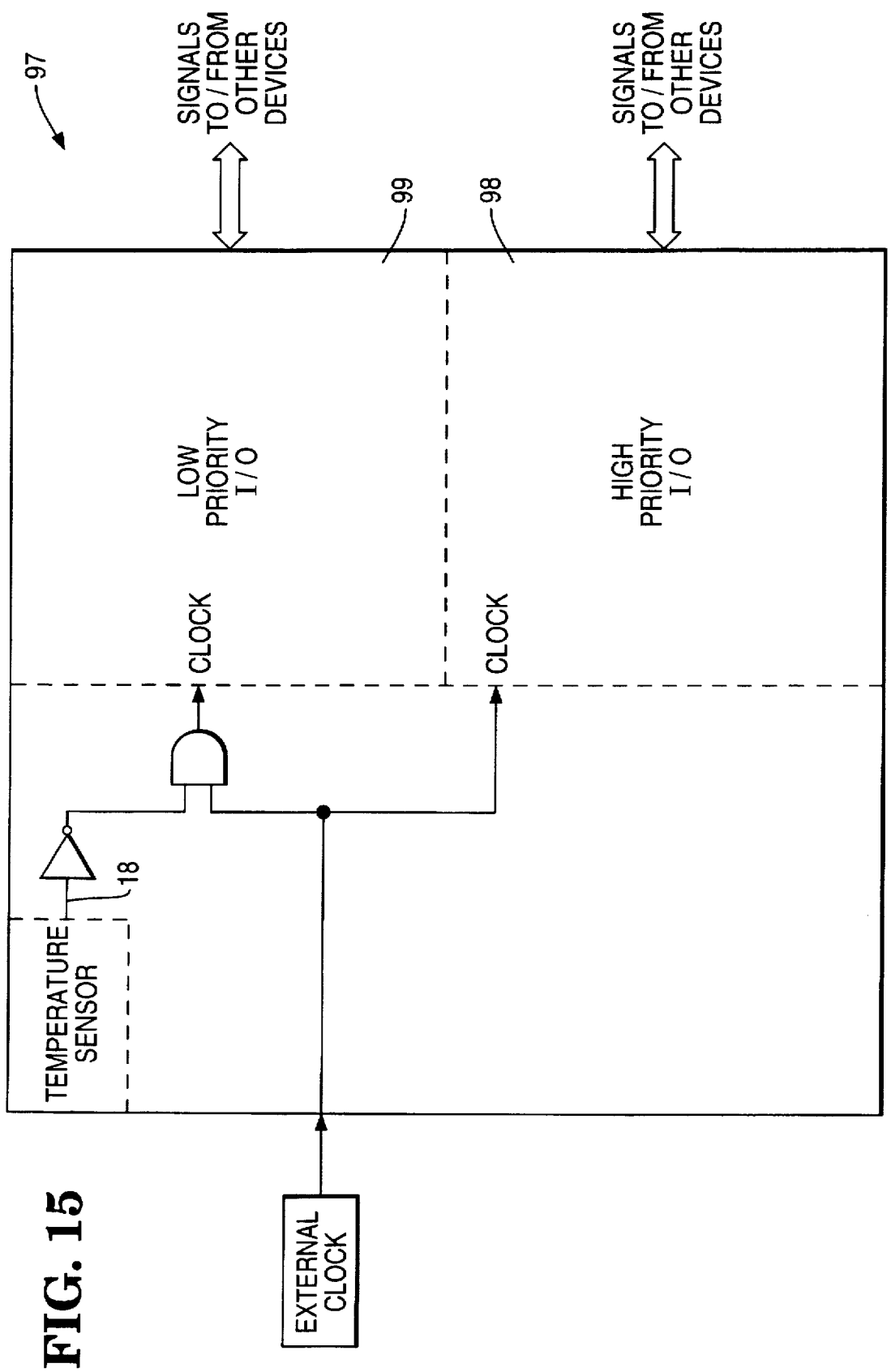
FIG. 15 shows an alternate system for selectively enabling and disabling portions of a device or circuit.

Another technique for selectively enabling/disabling parts of a device or circuit is shown in FIG. 15. Here, a microcomputer device 97 having a high priority I/O section 98 and a low priority I/O section 99 is shown. The clock signal to the low priority I/O section is selectively disabled based upon the output signal 18 of the temperature sensor. The disabling of the clock input to an I/O section results in the disablement of that section.

For fiber optic (or other data transmission) systems, the temperature sensing methods of this invention may be used to regulate the optical device's temperature or power dissipation. For example, device 46 of FIG. 4 could be a fiber optic transmitter which operates at a temperature regulated frequency.

For fixed clock rate transfer protocols, the invention may be used to control how often packets are sent. For radio frequency drive output circuitry, as might be encountered in wireless networks and cellular communications equipment, the invention may be used to select different baud rates or limit transmitter power.

In general, the temperature sensing capability of the present invention is used to dynamically adjust the operating frequency of numerous types of devices, such as electrical, electronic or optical. The attraction of this capability is that it allows a CPU or other type of device to operate at the maximum speed possible, without exceeding some temperature limit.

Numerous substitutions and modifications can be undertaken without departing from the true spirit and scope of the invention. What is desired to be secured by Letters Patent is the Invention as defined in the following claims.

I claim:

1. An improved integrated circuit device, comprising:
   a temperature sensing circuit disposed on said integrated-circuit device; and
   a controller, disposed on said integrated circuit device and operatively coupled to said temperature sensing circuit, comprising a phase-locked loop having an output, the output having a clock signal at a given frequency, and a divider circuit coupled to the output of the phase-locked loop and having a divide value based upon a sensed temperature.

2. The device of claim 1, wherein an output of the divider circuit provides a first clock signal for the integrated circuit device.

3. The improved integrated circuit device of claim 1, wherein the temperature sensing circuit comprises:
   a diode having an anode and cathode, the cathode coupled to a first supply voltage and the anode coupled to a comparator circuit input and a first resistor;
   a second resistor having a first node selectively coupled to the first supply voltage and a second node coupled to another input of the comparator circuit; and
   a third resistor having a first node selectively coupled to a second supply voltage and a second node coupled to the another input of the comparator.

4. The circuit of claim 3, further comprising a a fourth resistor having a first node-selectively coupled to the first supply voltage and a second node coupled to the another input of the comparator.

5. The circuit of claim 4, further comprising a a fifth resistor having a first node selectively coupled to the second supply voltage and a second node coupled to the another input of the comparator.

6. A method for operating the circuit of claim 3, comprising the step of selectively coupling any of the second and third resistors to their respective supply voltages.

7. The method of claim 6, wherein the step of selectively coupling comprises the step of enabling at least one transistor coupled between the respective first node and supply voltage.

8. A method for operating the circuit of claim 5, comprising the step of selectively coupling any of the second, third, fourth and fifth resistors to their respective supply voltages.

9. A system for generating a clock signal for clocking a device, said system comprising a temperature sensor circuit and a controller circuit, said controller circuit comprising:
   a counter operatively coupled to said temperature sensor circuit and having a counter value; and
   a phase-locked loop circuit operatively coupled to said clock signal, wherein said phase-locked loop circuit is regulated based upon said counter value.

10. The apparatus of claim 9, wherein the counter value is updated in response to a control signal.

11. The apparatus of claim 10, wherein the control signal is a second clock signal.

12. The apparatus of claim 11, further comprising means for disabling the second clock signal for at least one clock period.

13. The circuit of claim 9, further comprising a central processing unit coupled to the phase-locked loop and having an execution unit and a bus interface.

14. The circuit of claim 13, further comprising means for operating said bus interface at a predetermined frequency.

15. The system of claim 9, wherein the temperature sensor circuit comprises:
   a diode having an anode and cathode, the cathode coupled to a first supply voltage and the anode coupled to a comparator circuit input and a first resistor;
   a second resistor having a first node selectively coupled to the first supply voltage and a second node coupled to another input of the comparator circuit; and a third resistor having a first node selectively coupled to a second supply voltage and a second node coupled to the another input of the comparator.

16. A method for operating the circuit of claim 15, comprising the step of selectively coupling any of the second and third resistors to their respective supply voltages.

17. The method of claim 16, wherein the step of selectively coupling comprises the step of enabling at least one transistor coupled between the respective first node and supply voltage.

18. A system for generating a clock signal for clocking a device, said system comprising a temperature sensor circuit and a controller circuit, said controller circuit comprising:
a phase-locked loop circuit operatively coupled to said clock signal; and
a divider circuit operatively coupled to said phase-locked loop circuit, wherein said divider circuit is regulated by said temperature sensor circuit.

19. A system for providing a clock signal to an integrated circuit device, comprising a temperature sensing circuit disposed on said integrated circuit device and a controller operatively coupled to said temperature sensing circuit, said controller comprising:
a PLL input;
a phase detector;
a PLL output;
a first divider circuit having a first divider input coupled to the PLL output and having a first divider output coupled to an input of the phase detector; and
a second divider circuit having a second divider input coupled to the PLL input and having a second divider output coupled to another input of the phase detector.

20. The circuit of claim 19, wherein the first divider circuit has a first programmable divide value.

21. The circuit of claim 20, wherein the second divider circuit has a second programmable divide value.

22. The circuit of claim 20, wherein the first programmable divide value is software programmable.

23. The circuit of claim 21, wherein the second programmable divide value is based upon temperature.

24. The circuit of claim 22, wherein the second programmable divide value is based upon temperature.

25. An improved integrated circuit device, comprising:
a temperature sensing circuit disposed on said integrated circuit device; and
a controller, disposed on said integrated circuit device and operatively coupled to said temperature sensing circuit, comprising a counter that is updated in response to a control signal, wherein the controller generates a clock signal for the integrated circuit device and the control signal is a second clock signal, and further wherein the counter generates at least one clock select signal for selecting one of a plurality of clocks having frequencies of 1X and nX, where nX is an integer multiple of X, as the clock signal.

26. An improved integrated circuit device, comprising:
a temperature sensing circuit disposed on said integrated circuit device; and
a controller, disposed on said integrated circuit device and operatively coupled to said temperature sensing circuit, comprising a counter that is updated in response to a control signal, wherein the controller comprises a voltage controlled oscillator and a voltage divider coupled between the counter and voltage controlled oscillator, wherein the controller generates a clock signal for the integrated circuit device and the control signal is a second clock signal.

27. A method for generating a clock signal as a function of temperature, comprising the steps of:
changing a value in a counter when a sensed temperature exceeds a first threshold value;
changing the value in the counter when the sensed temperature is less than a second threshold value;
generating a voltage based upon the value in the counter; and
applying the voltage to a variable controlled oscillator.

28. The method of claim 27, wherein the first and second threshold values are different.

29. The method of claim 27, wherein the first and second threshold values are set by a CPU.

30. The method of claim 27, wherein the voltage is generated by a voltage divider coupled to an output of the counter.

31. A method for generating a clock signal as a function of temperature, comprising the steps of:
changing a value in a counter when a sensed temperature exceeds a first threshold value;
changing the value in the counter when the sensed temperature exceeds a second threshold value;
generating a voltage based upon the value in the counter; and
applying the voltage to a variable controlled oscillator.

32. The method of claim 31, wherein the first and second threshold values are set by a CPU.

33. The method of claim 31, wherein the voltage is generated by a voltage divider coupled to an output of the counter.

34. An improved integrated circuit device, comprising:
a plurality of temperature sensing circuits disposed on said integrated circuit device; and
a selector for selecting at least one of the plurality of temperature sensor circuits to determine operating frequency of the integrated circuit device, wherein one of the plurality of temperature sensor circuits establishes an upper trip point, and another of the plurality of temperature sensor circuits establishes a lower trip point.

35. A programmable threshold temperature sensing circuit, comprising:
a diode having an anode and cathode, the cathode coupled to a first supply voltage and the anode coupled to a comparator circuit input and a first resistor;
a second resistor having a first node selectively coupled to the first supply voltage and a second node coupled to another input of the comparator circuit; and
a third resistor having a first node selectively coupled to a second supply voltage and a second node coupled to the another input of the comparator.

36. The circuit of claim 35, further comprising a a fourth resistor having a first node selectively coupled to the first supply voltage and a second node coupled to the another input of the comparator.

37. The circuit of claim 36, further comprising a a fifth resistor having a first node selectively coupled to the second supply voltage and a second node coupled to the another input of the comparator.

38. A method for operating the circuit of claim 35, comprising the step of selectively coupling any of the second and third resistors to their respective supply voltages.

39. The method of claim 38, wherein the step of selectively coupling comprises the step of enabling at least one transistor coupled between the respective first node and supply voltage.

40. A method for operating the circuit of claim 37, comprising the step of selectively coupling any of the second, third, fourth and fifth resistors to their respective supply voltages.

* * * * *